(12) United States Patent
Cheng et al.

(10) Patent No.: US 11,043,847 B2
(45) Date of Patent: Jun. 22, 2021

(54) WIRELESS CHARGING RECEIVER

(71) Applicant: The Hong Kong University of Science and Technology, Hong Kong (CN)

(72) Inventors: Lin Cheng, Hong Kong (CN); Wing Hung Ki, Hong Kong (CN); Tak Sang Yim, Hong Kong (CN); Chi Ying Tsui, Hong Kong (CN); Yat To Wong, Hong Kong (CN)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 450 days.

(21) Appl. No.: 15/762,525

(22) PCT Filed: Sep. 26, 2016

(86) PCT No.: PCT/CN2016/100050
§ 371 (c)(1),
(2) Date: Mar. 22, 2018

(87) PCT Pub. No.: WO2017/050290
PCT Pub. Date: Mar. 30, 2017

(65) Prior Publication Data
US 2019/0074721 A1 Mar. 7, 2019

Related U.S. Application Data

(60) Provisional application No. 62/233,287, filed on Sep. 25, 2015, provisional application No. 62/287,397, filed on Jan. 26, 2016.

(51) Int. Cl.
*H02J 7/00* (2006.01)
*H02J 7/14* (2006.01)
(Continued)

(52) U.S. Cl.
CPC ............. *H02J 50/12* (2016.02); *G05F 1/565* (2013.01); *H02J 7/00* (2013.01); *H02J 7/025* (2013.01);
(Continued)

(58) Field of Classification Search
USPC ........................................................ 320/132
See application file for complete search history.

(56) References Cited

U.S. PATENT DOCUMENTS 4,232,260 A * 11/1980 Lambkin ............... H02J 7/0003
320/110
5,804,950 A * 9/1998 Hwang ............... H02M 1/4225
323/222
(Continued)

FOREIGN PATENT DOCUMENTS

CN 1374740 A 10/2002
CN 1961353 A 5/2007
(Continued)

OTHER PUBLICATIONS

Tseng et al., "Introduction to the alliance for wireless power loosely-coupled wireless power transfer system specification version 1.0," in IEEE Wireless Power Transfer, May 2013, pp. 79-83.
(Continued)

*Primary Examiner* — Alexis B Pacheco
(74) *Attorney, Agent, or Firm* — Amin, Turocy & Watson, LLP

(57) ABSTRACT

A wireless charging receiver as described herein includes a configurable rectifier configured to convert an alternating current input to a direct current output in a single processing stage, wherein the configurable rectifier comprises one or more diodes, and a controller communicatively coupled to the one or more diodes and configured to select one of a plurality of mode cycling schemes and control a present
(Continued)

operating mode of the active diodes according to a selected mode cycling scheme. Additionally, an active diode as described herein includes a comparator, a gate driver, a power transistor, and a delay compensation circuit for compensation of at least one of a turn-on delay and a turn-off delay of the active diode, the delay compensation circuit including analog feedback loops.

20 Claims, 18 Drawing Sheets

(51) Int. Cl.
| | |
|---|---|
| H02J 50/12 | (2016.01) |
| H02J 7/02 | (2016.01) |
| H04B 5/00 | (2006.01) |
| G05F 1/565 | (2006.01) |
| H03K 5/24 | (2006.01) |
| H02M 7/219 | (2006.01) |

(52) U.S. Cl.
CPC ......... *H03K 5/2472* (2013.01); *H04B 5/0037* (2013.01); *H04B 5/0075* (2013.01); *H02J 2207/20* (2020.01); *H02M 7/219* (2013.01); *H04B 5/0093* (2013.01)

(56) References Cited

U.S. PATENT DOCUMENTS

| | | | | |
|---|---|---|---|---|
| 5,982,645 | A * | 11/1999 | Levran | H01F 27/306 363/37 |
| 6,504,270 | B1 * | 1/2003 | Matsushita | H02M 3/33561 307/140 |
| 9,379,641 | B2 * | 6/2016 | Potharaju | H02M 7/5387 |
| 2002/0113494 | A1 * | 8/2002 | Winick | H02J 1/108 307/85 |
| 2002/0140403 | A1 * | 10/2002 | Reddy | H02M 7/4807 320/162 |
| 2010/0060245 | A1 * | 3/2010 | Namuduri | H02P 9/02 322/89 |
| 2012/0051109 | A1 | 3/2012 | Kim et al. | |
| 2012/0155136 | A1 | 6/2012 | Von Novak et al. | |
| 2012/0194124 | A1 | 8/2012 | Toivola et al. | |
| 2012/0307537 | A1 * | 12/2012 | Ramorini | H02M 7/219 363/126 |
| 2013/0009609 | A1 * | 1/2013 | Andersen | H02J 5/005 320/166 |
| 2013/0043734 | A1 | 2/2013 | Stone et al. | |
| 2013/0234669 | A1 * | 9/2013 | Huang | H02J 7/0029 320/126 |
| 2014/0159655 | A1 | 6/2014 | Kim et al. | |
| 2014/0232366 | A1 * | 8/2014 | Lawson | H02M 7/04 323/282 |
| 2015/0229230 | A1 * | 8/2015 | Mehringer | H02H 7/067 363/127 |
| 2015/0244176 | A1 * | 8/2015 | Van Den Brink | H04B 5/0037 307/104 |
| 2015/0349538 | A1 * | 12/2015 | Agostinelli | H02J 50/80 307/104 |
| 2016/0043562 | A1 * | 2/2016 | Lisi | H02J 7/0047 307/104 |
| 2016/0176300 | A1 * | 6/2016 | Bucher | B60L 11/182 307/104 |
| 2017/0141585 | A1 * | 5/2017 | Walley | H02J 50/12 |
| 2017/0353054 | A1 * | 12/2017 | Lee | H05B 6/1236 |

FOREIGN PATENT DOCUMENTS

| | | |
|---|---|---|
| CN | 203660621 U | 6/2014 |
| WO | 2014/196737 A1 | 12/2014 |

OTHER PUBLICATIONS

Wu et al., "A 13.56 MHz 40 mW CMOS high-efficiency inductive link power supply utilizing on-chip delay-compensated voltage doubler rectifier and multiple LDOs for implantable medical devices," IEEE J. Solid-State Circuits, vol. 49, No. 11, pp. 2397-2407, Nov. 2014.

Kiani et al., "A Q-modulation technique for efficient inductive power transmission," IEEE J. Solid-State Circuits, vol. 50, No. 12, pp. 2839-2848, Dec. 2015.

Moon et al., "A 3.0-W wireless power receiver circuit with 75-% overall efficiency," in IEEE Asian Solid-State Circuits Conf., Nov. 2012, pp. 97-100.

Moh et al., "A fully integrated 6W wireless power receiver operating at 6.78MHz with magnetic resonance coupling," in IEEE ISSCC Dig. Tech. Papers, Feb. 2015, pp. 230-231.

Riehl et al., "Wireless power systems for mobile devices supporting inductive and resonant operating modes," IEEE. Trans. Microw. Theory Tech., vol. 63, No. 3, pp. 780-790, Mar. 2015.

Park et al., "A design of a wireless power receiving unit with a high-efficiency 6.78-MHz active rectifier using shared DLLs for magnetic-resonant A4WP applications," IEEE Trans. Power Electron., vol. 31, No. 6, pp. 4484-4498, Jun. 2016.

Choi et al., "Resonant regulating rectifiers (3R) operating for 6.78 MHz resonant wireless power transfer (RWPT)," IEEE J. Solid-State Circuits, vol. 48, No. 12, pp. 2989-3001, Dec. 2013.

Li et al., "A 1156 MHz wireless power transfer system with reconfigurable resonant regulating rectifier and wireless power control for implantable medical devices," IEEE J. Solid-State Circuits, vol. 50, No. 4, pp. 978-989, Apr. 2015.

Lam et al., "Integrated Low-Loss CMOS Active Rectifier for Wirelessly Powered Devices," IEEE Trans. Circuits Syst. II Express Briefs, vol. 53, No. 12, pp. 1378-1382, Dec. 2006.

Guo et al., "An Efficiency-Enhanced CMOS Rectifier With Unbalanced-Biased Comparators for Transcutaneous-Powered High-Current Implants," IEEE J. Solid-State Circuits, vol. 44, No. 6, pp. 1796-1804, Jun. 2009.

Cha et al., "A CMOS Rectifier With a Cross-Coupled Latched Comparator for Wireless Power Transfer in Biomedical Applications," IEEE Trans. Circuits Syst. II Express Briefs, vol. 59, No. 7, pp. 409-413, Jul. 2012.

Lu et al., "A 13.56 MHz CMOS Active Rectifier With Switched-Offset and Compensated Biasing for Biomedical Wireless Power Transfer Systems," IEEE Trans. Biomed. Circuits Syst., vol. 8, No. 3, pp. 334-344, Jun. 2014.

Cheng et al., "Adaptive on/off delay-compensated active rectifiers for wireless power transfer systems," IEEE J. Solid-State Circuits, vol. 51, No. 3, pp. 712-723, Mar. 2016.

Lee et al., "An adaptive reconfigurable active voltage doubler/rectifier for extended-range inductive power transmission," in IEEE ISSCC Dig. Tech. Papers, Feb. 2012, pp. 286-288.

Lu et al., "A 13 56MHz fully integrated 1X/2X active rectifier with compensated bias current for inductively powered devices," in IEEE ISSCC Dig. Tech. Papers, Feb. 2013, pp. 66-67.

H. Lee, "An auto-reconfigurable 2x/4x AC-DC regulator for wirelessly powered biomedical implants with 28% Link efficiency enhancement," IEEE Trans. Very Large Scale Integr. Syst., vol. 24, No. 4, pp. 1598-1602, Apr. 2016.

Lee et al., "A power-efficient wireless system with adaptive supply control for deep brain stimulation," IEEE J. Solid-State Circuits, vol. 48, No. 9, pp. 2203-2216, Sep. 2013.

Kim et al., "A 144MHz Integrated Resonant Regulating Rectifier with Hybrid Pulse Modulation," in IEEE Symp. on VLSI Circuits, Jun. 2015, pp. C284-C285.

Shinoda et al., "Voltage-boosting wireless power delivery system with fast load tracker by $\Delta\Sigma$-modulated sub-harmonic resonant switching," in IEEE ISSCC Dig. Tech. Papers, Feb. 2012, pp. 288-290.

Tomita et al., "1-W 3.3-16.3-V boosting wireless power transfer circuits with vector summing power controller," IEEE J. Solid-State Circuits, vol. 47, No. 11, pp. 2576-2585, Nov. 2012.

(56) References Cited

OTHER PUBLICATIONS

Cheng et al., "A 6.78MHz 6W wireless power receiver with a 3-level 1x / ½ / 0x reconfigurable resonant regulating rectifier," in IEEE ISSCC Dig. Tech. Papers, Jan. 2016, pp. 376-377.
Liu et al., "Optimal operation of contactless transformers with resonance in secondary circuits," in IEEE Applied Power Electronics Conference and Exposition, Feb. 2008, pp. 645-650.
Schuylenbergh et al., "Inductive Powering—Basic Theory and Application to Biomedical Systems", New York, NY, USA: Springer, 2009. 3 pages.
Zhang et al., "Analysis and comparison of secondary series- and parallel-compensated inductive power transfer systems operating for optimal efficiency and load-independent voltage-transfer ratio," IEEE Trans. Power Electron., vol. 29, No. 6, pp. 2979-2990, Jun. 2014.
Cheng et al., "A 10/30 MHz fast reference-tracking buck converter with DDA-based Type-III compensator," IEEE J. Solid-State Circuits, vol. 49, No. 12, pp. 2788-2799, Dec. 2014.
Erickson "Fundamentals of Power Electronics", Boston, MA: Springer US, 2004. 1326 pages.
Lee et al., "An Integrated Power-Efficient Active Rectifier With Offset-Controlled High Speed Comparators for Inductively Powered Applications," IEEE Trans. Circuits Syst. Regul. Pap., vol. 58, No. 8, pp. 1749-1760, Aug. 2011.
Chung et al., "A 0.025-0.45 W 60%-Efficiency Inductive-Coupling Power Transceiver With 5-Bit Dual-Frequency Feedforward Control for Non-Contact Memory Cards," IEEE J. Solid-State Circuits, vol. 47, No. 10, pp. 2496-2504, Oct. 2012.
Kiani et al., "A power-management ASIC with Q-modulation capability for efficient inductive power transmission," IEEE ISSCC Dig. Tech. Papers, 2015, pp. 226-227.
Choi et al., "A resonant regulating rectifier (3R) operating at 6.78 MHz for a 6W wireless charger with 86% efficiency," IEEE ISSCC Dig. Tech. Papers, 2013, pp. 64-65.
Li et al., "A 13.56MHz wireless power transfer system with reconfigurable resonant regulating rectifier and wireless power control for implantable medical devices," IEEE Symp. VLSI Circuits Dig. Tech. Papers, 2014, pp. 23-24.
Hashemi et al., "A high-efficiency low-voltage CMOS rectifier for harvesting energy in implantable devices," IEEE Trans. Biomed. Circuits Syst., vol. 6, No. 4, pp. 326-335, Aug. 2012.
International Search Report for PCT Application No. PCT/CN2016/100050, dated Jan. 4, 2017, 2 pages.

\* cited by examiner

WIRELESS CHARGING RECEIVER

CROSS-REFERENCE TO RELATED APPLICATIONS

The present application is a U.S. National Stage filing under 35 U.S.C. § 371 of international patent cooperation treaty (PCT) application No. PCT/CN2016/100050, filed Sep. 26, 2016, and entitled "WIRELESS CHARGING RECEIVER", which applications further claim the benefit of priority to U.S. Provisional Patent Application No. 62/233,287, filed Sep. 25, 2015, and entitled "Delay-Compensated Active Diodes for Wireless Power Transfer Systems," and U.S. Provisional Patent Application No. 62/287,397, filed Jan. 26, 2016, and entitled "Wireless Charging Receiver," the respective entireties of which applications are incorporated herein by reference.

TECHNICAL FIELD

The present disclosure relates to wireless power transfer, and in particular, to receivers for wireless power transfer systems and diodes implemented in said receivers.

BACKGROUND

Techniques for wireless power transfer (WPT), e.g., WPT using near-field magnetic coupling, have attracted extensive attention recently. WPT has a broad range of applications, such as biomedical implants, battery chargers for portable electronic devices and/or electric vehicles, as well as other applications. In particular, wireless charging is developing into a standard feature of portable electronic devices in a coordinated effort to "cut the last wire" and allow for a fully wireless user experience.

WPT is generally achieved via the use of inductive coils, e.g., a power transmitter transfers power via a primary coil to a secondary coil at a power receiver, Multiple types of WPT systems exist, such as inductive power transfer (IPT) systems and resonant wireless power transfer (R-WPT) systems. In an IPT system, the primary coil and the secondary coil are placed close to each other with precise alignment, operating as a tightly coupled air-core transformer. In an R-WPT system, magnetic resonance is used to compensate for leakage inductance so that power can still be efficiently transferred even the coils are loosely coupled.

With regard to WPT systems generally, it is desirable to implement systems that increase power transfer efficiency and decrease chip area and production cost.

SUMMARY

The following summary is a general overview of various embodiments disclosed herein and is not intended to be exhaustive or limiting upon the disclosed embodiments. Embodiments are better understood upon consideration of the detailed description below in conjunction with the accompanying drawings and claims.

In one embodiment, a wireless charging receiver is described herein. The wireless charging receiver includes a configurable rectifier configured to convert an alternating current input to a direct current output in a single processing stage. The configurable rectifier includes one or more diodes. The wireless charging receiver additionally includes a controller communicatively coupled to the one or more diodes. The controller is configured to select one of a plurality of mode cycling schemes and to control a present operating mode of the one or more diodes according to a selected mode cycling scheme.

In another embodiment, an active diode is described herein. The active diode includes a comparator, a gate driver, a power transistor, and a delay compensation circuit for compensation of at least one of a turn-on delay and a turn-off delay of the active diode. The delay compensation circuit includes analog feedback loops.

In a further embodiment, a method is described herein. The method includes obtaining a sampled first voltage of a power transistor of an active diode in response to the active diode transitioning to an on state from an off state or to the off state from the on state, comparing the sampled first voltage to a second voltage of the power transistor of the active diode, generating an offset current based on the comparing, where the offset current at least partially compensates for a delay associated with the active diode transitioning to the on state from the off state or to the off state from the on state, and outputting the offset current to a comparator of the active diode.

DESCRIPTION OF DRAWINGS

Various non-limiting embodiments of the subject disclosure are described with reference to the following figures, wherein like reference numerals refer to like parts throughout unless otherwise specified.

DETAILED DESCRIPTION

Various specific details of the disclosed embodiments are provided in the description below. One skilled in the art will recognize, however, that the techniques described herein can in some cases be practiced without one or more of the specific details, or with other methods, components, materials, etc. In other instances, well-known structures, materials, or operations are not shown or described in detail to avoid obscuring certain aspects.

Figure 1:
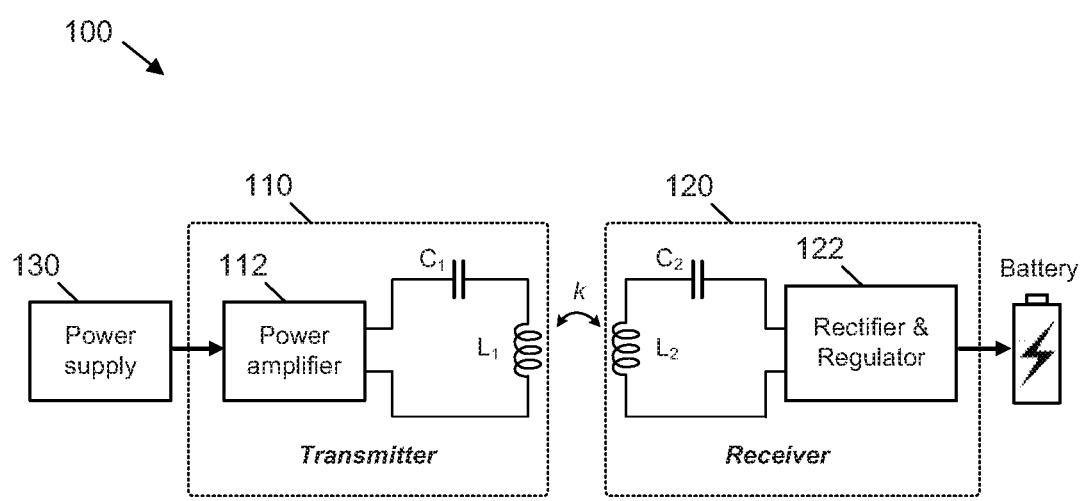
FIG. 1 is a schematic block diagram of a wireless power transfer system.

Referring first to FIG. 1, an example wireless charging system 100 includes a power transmitter 110 and a power receiver 120 that are inductively coupled via a primary coil and a secondary coil, respectively. A power amplifier 112 at power transmitter 110 receives a power input from a power supply 130 and drives the primary coil to generate magnetic fluxes that induce an AC voltage at the secondary coil, Power receiver 120, via a rectifier 122, converts the AC voltage to a DC voltage for powering up associated loading circuits. As shown in FIG. 1, rectifier 122 may also include a regulator and/or other components.

WPT systems, such as system 100, can be classified into multiple types, such as inductive power transfer (IPT) and resonant wireless power transfer (R-WPT). In an IPT system, the primary coil and the secondary coil are placed close to each other with precise alignment, operating as a tightly coupled air-core transformer. In an R-WPT system, magnetic resonance is used to compensate for leakage inductance so that power can still be efficiently transferred even the coils are loosely coupled. Industry consortia, such as the Wireless Power Consortium (WPC), Power Matters Alliance (PMA), and Alliance for Wireless Power (A4WP) have been established to create specifications for WPT and other related systems. The specifications issued by WPC and PMA, such as the "Qi" standard, are generally regarded as IPT solutions, while A4WP develops specifications for R-WPT that aim at providing spatial freedom and charging multiple devices concurrently.

Existing wireless charging receivers generally adopt a two-stage topology, in which the first stage is a rectifier for AC-DC conversion and the second stage is a buck converter or a low dropout regulator (LDO) for DC-DC regulation. However, two-stage power processing degrades system efficiency and adds extra volume and cost. For instance, a conventional resonant regulating rectifier implements a passive rectifier followed by a step-down charge pump to produce a regulated output voltage. This rectifier consists of three on-chip power switches, five off-chip diodes and three off-chip capacitors; further, mode selection between continuous conduction mode (CCM) and discontinuous conduction mode (DCM) must be done manually. As another example, an existing 1×/2× reconfigurable resonant regulating rectifier achieves one-stage power conversion plus voltage regulation using five on-chip switches and one off-chip capacitor. However, the output power of this rectifier is in the mW range, and the rectifier is not readily scalable to high-power applications (e.g., 6 W). Additionally, the conventional receivers described above have a 5V output, and as a result high-voltage transistors that occupy large silicon area are used.

Figure 2:
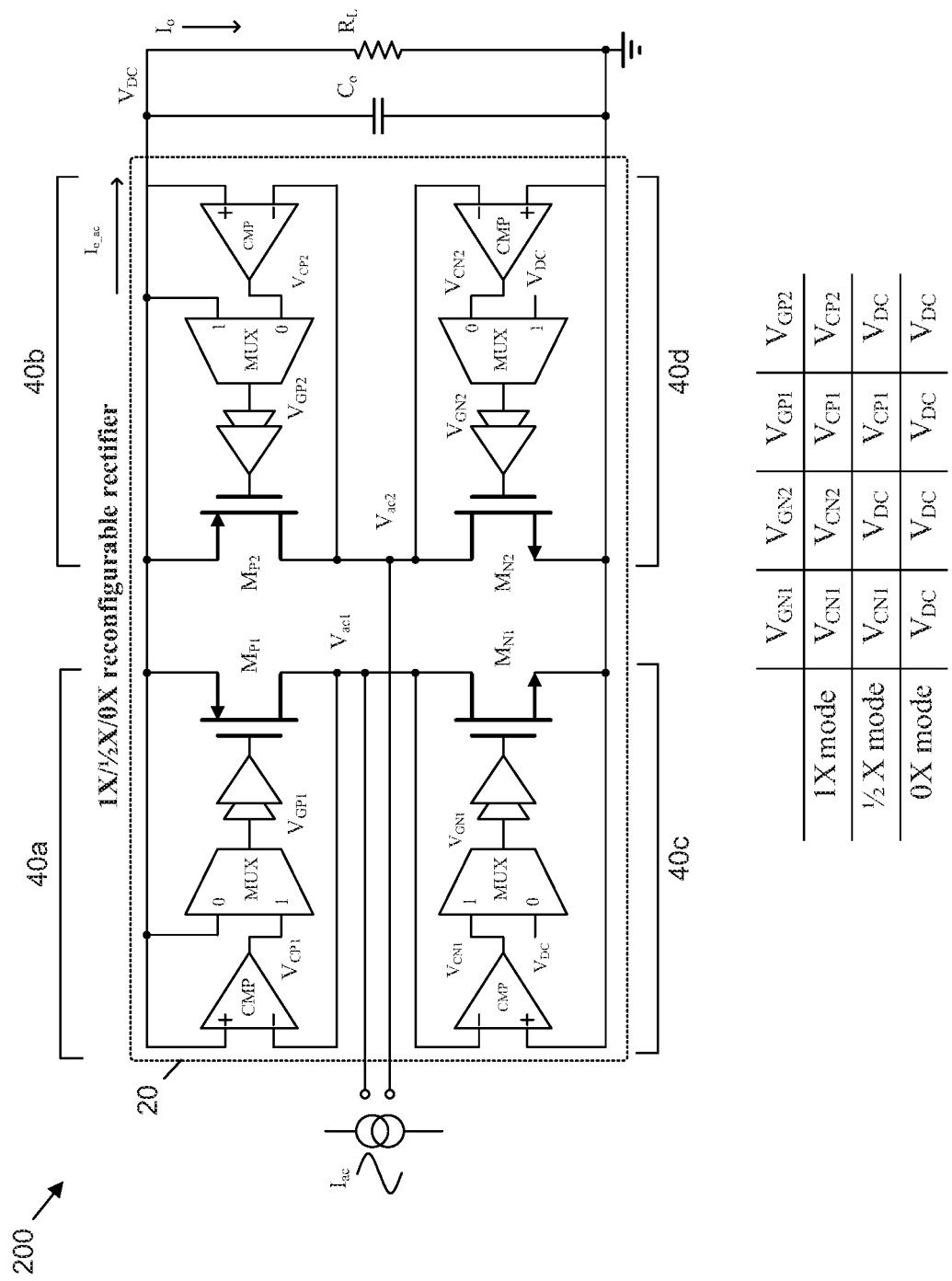
FIG. 2 is a schematic diagram of a wireless charging receiver with a reconfigurable rectifier.

FIG. 2 illustrates a wireless charging system 200 having a configurable rectifier 20 that improves upon the efficiency and cost of the existing wireless charging receivers discussed above. The receiver of wireless charging system 200 realizes one-stage power conversion plus voltage regulation and complies with the specifications released by A4WP. Rectifier 20 includes a set of diodes 40, here four active diodes 40a-d, to convert an AC input to a DC output in a single processing stage. While rectifier 20 is illustrated as having active diodes 40a-d, one or more passive diodes could also be used in addition to or in place of respective active diodes.

In an aspect, rectifier 20 includes four on-chip power transistors ($M_{N1,2}$ and $M_{P1,2}$) and 1 off-chip capacitor ($C_o$). Rectifier 20 utilizes three-level operation to reduce output voltage ripples and accomplish switching synchronization easily during mode switching. More particularly, by controlling the gate-drive signals of the power transistors $M_{N1,2}$ and $M_{P1,2}$, the rectifier can be configured into a 1× mode, ½× mode and 0× mode, respectively. These operating modes are described in more detail below. In principle, power regulation can be done by switching between 1× mode and 0× mode. Alternatively, three-level operation can be used to result in more even distribution of power with reduced output voltage ripples by switching among 1× mode, ½× mode and 0× mode.

Moreover, rectifier 20 utilizes a controller to regulate the output voltage in the full loading range and to achieve fast transient responses, and an adaptive sizing method is employed to further improve the light load efficiency of the receiver. This and other aspects of the operation of rectifier 20 and diodes 40 are described in more detail below.

Figure 3:
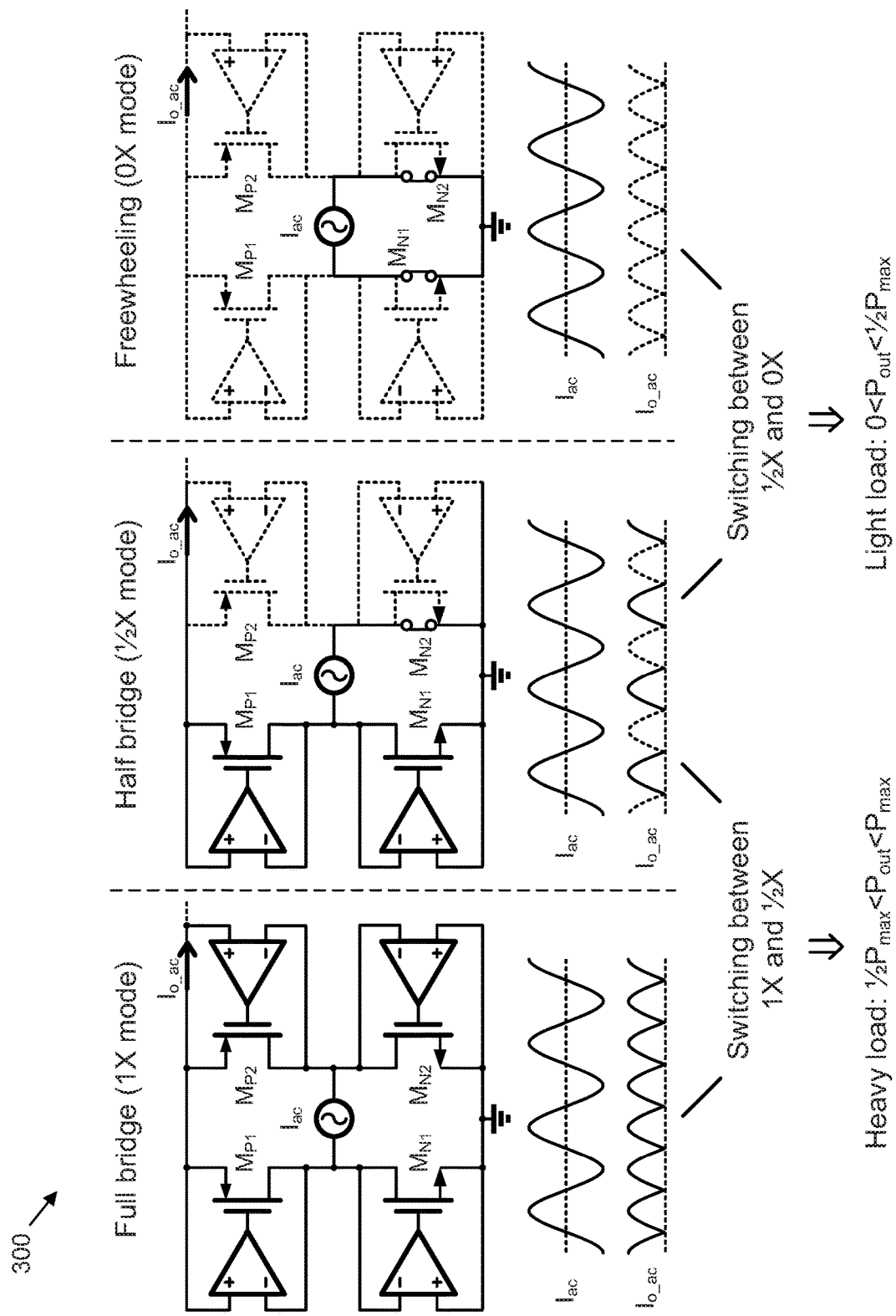
FIGS. 3-4 are diagrams illustrating respective operating modes employable by the wireless charging receiver of FIG. 2.

As stated above, rectifier 20 can be configured to operate according to one or more operating modes, which can in turn be selected according to a mode cycling scheme and/or through other means. Diagram 300 in FIG. 3 illustrates three such operating modes. In particular, diagram 300 illustrates a first operating mode corresponding to full-bridge rectifier operation (1× mode), a second operating mode corresponding to half-bridge rectifier operation (½× mode), and a third operating mode corresponding to freewheeling or freewheeling diode operation (0× mode), Other operating modes, which can correspond to these or other power-delivering capabilities, are also possible. To achieve voltage regulation, diagram 300 further illustrates that rectifier 20 can be designed to switch periodically between operating modes. For instance, rectifier 20 can be configured to switch periodically between 1× mode and ½× and/or between ½× mode and 0× mode based at least in part on a load level of the corresponding wireless charging receiver, Diagram 300 illustrates rectifier 20 being switched between 1× mode and ½× mode in heavy load (e.g., when the receiver load is between 50-100% of maximum output), and between ½× mode and 0× mode in light load (e.g., when receiver load is between 0-50% of maximum output), respectively, Other loading conditions, and/or other conditions affecting the switching of rectifier 20 between operating modes, may also be used, Additionally, while not illustrated in diagram 300, rectifier 20 can in some cases also be switched between 0× mode and 1× mode.

In principle, power regulation can be done by switching between 1× mode and 0× mode. Alternatively, the three-level operation described above can be used to result in more even distribution of power with reduced output voltage ripples by switching among 1× mode, ½× mode and 0× mode. If rectifier 20 only switches between 1× mode and 0× mode, the output capacitor will be continuously charged for several resonant cycles and then discharged for several resonant cycles, resulting in large output ripple voltage $\Delta V_o$. With the three-level operation, the rectifier can work in a pure ½× mode instead of switching between 1× mode and 0× mode, and thus the $\Delta V_o$ is reduced.

Figure 4:
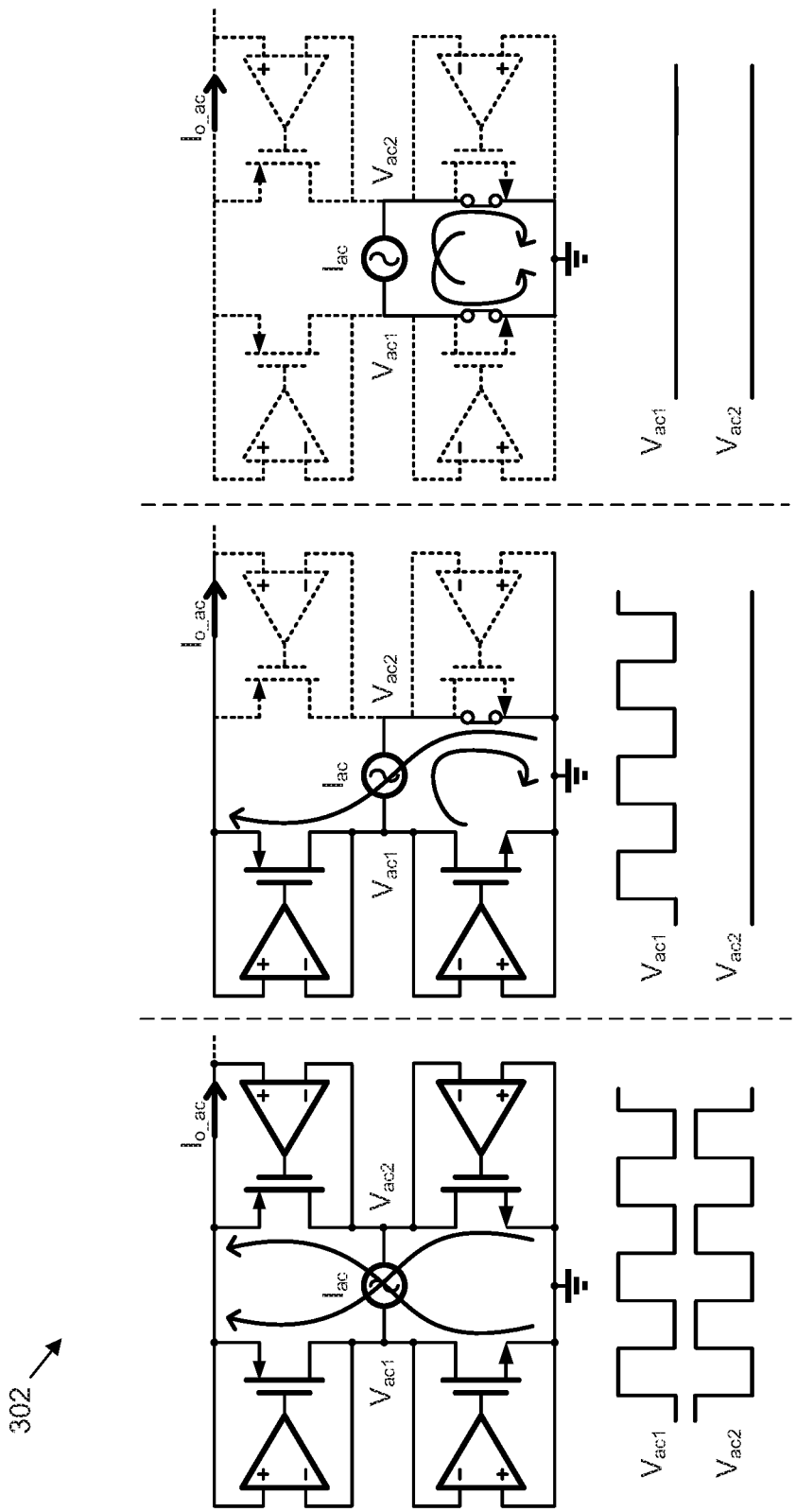

By utilizing the three-level operation scheme illustrated by diagram 300, which switches among 1× Triode, ½× mode and 0× mode, power can be more evenly distributed as compared to conventional WPT systems, thereby reducing output voltage ripples and/or other causes of inefficiency. Additionally, periodic operating modes having a common period can be utilized to further increase system efficiency. As shown by diagram 302 in FIG. 4, the ½× mode discussed above shares the same half-cycle operation with both the 1× mode and the 0× mode. This feature can be used to achieve switching synchronization during mode switching.

Compared to two-stage power conversion, one-stage power conversion using rectifier 20 can achieve higher power efficiency. Moreover, rectifier 20 can be implemented in one embodiment using four on-chip power switches and one off-chip capacitor, thereby additionally reducing volume and cost compared to conventional approaches. Furthermore, rectifier 20 can be implemented in another embodiment in a standard CMOS process using only 5 V transistors when the output voltage is regulated at 5 V.

Figure 5:
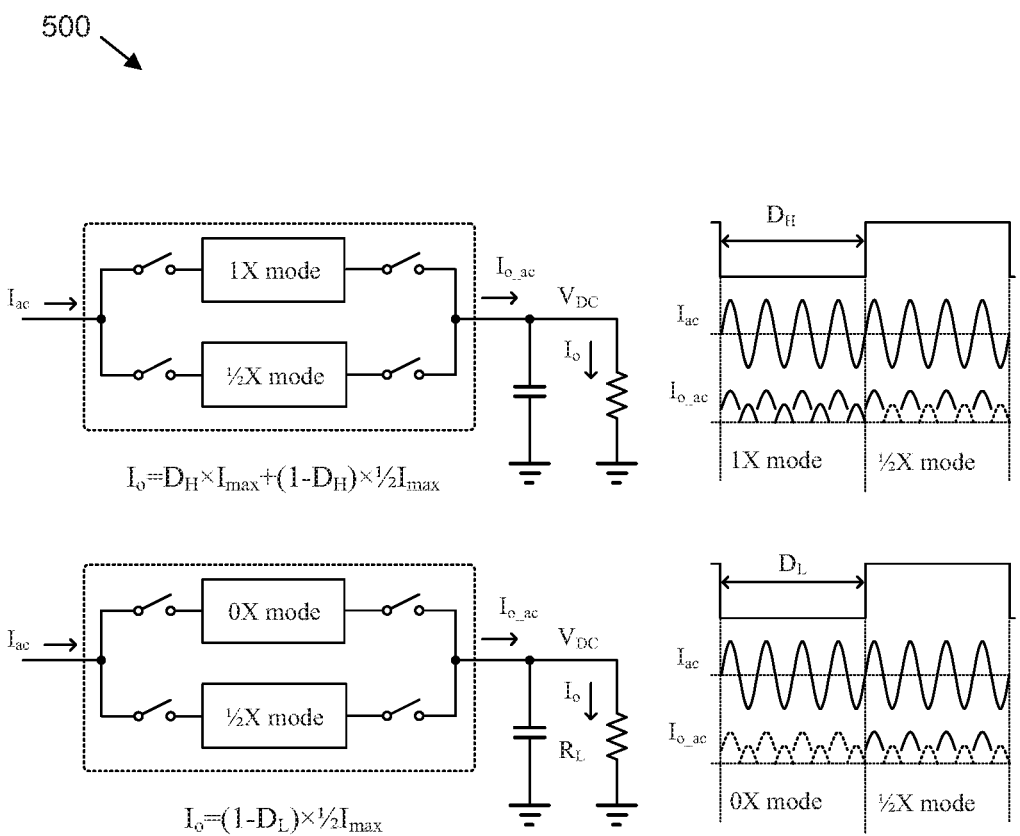
FIG. 5 is a diagram illustrating example operation of a wireless charging receiver.

If rectifier 20 is designed to switch periodically among the three modes described above, it can deliver any intermediate current between 0 and $I_{max}$ depending on the duty ratios of each mode. Thus, a pulse width modulation (PWM) mechanism that modulates the input current can be used to regulate the output voltage. For instance, as shown by diagram 500 in FIG. 5, a rectifier is switched periodically between 1× mode and ½× mode in heavy load (e.g., when ½$I_{max}$<$I_o$<$I_{max}$); and between ½× mode and 0× mode in light load (e.g., when 0<$I_o$<½$I_{max}$), respectively.

Figure 6:
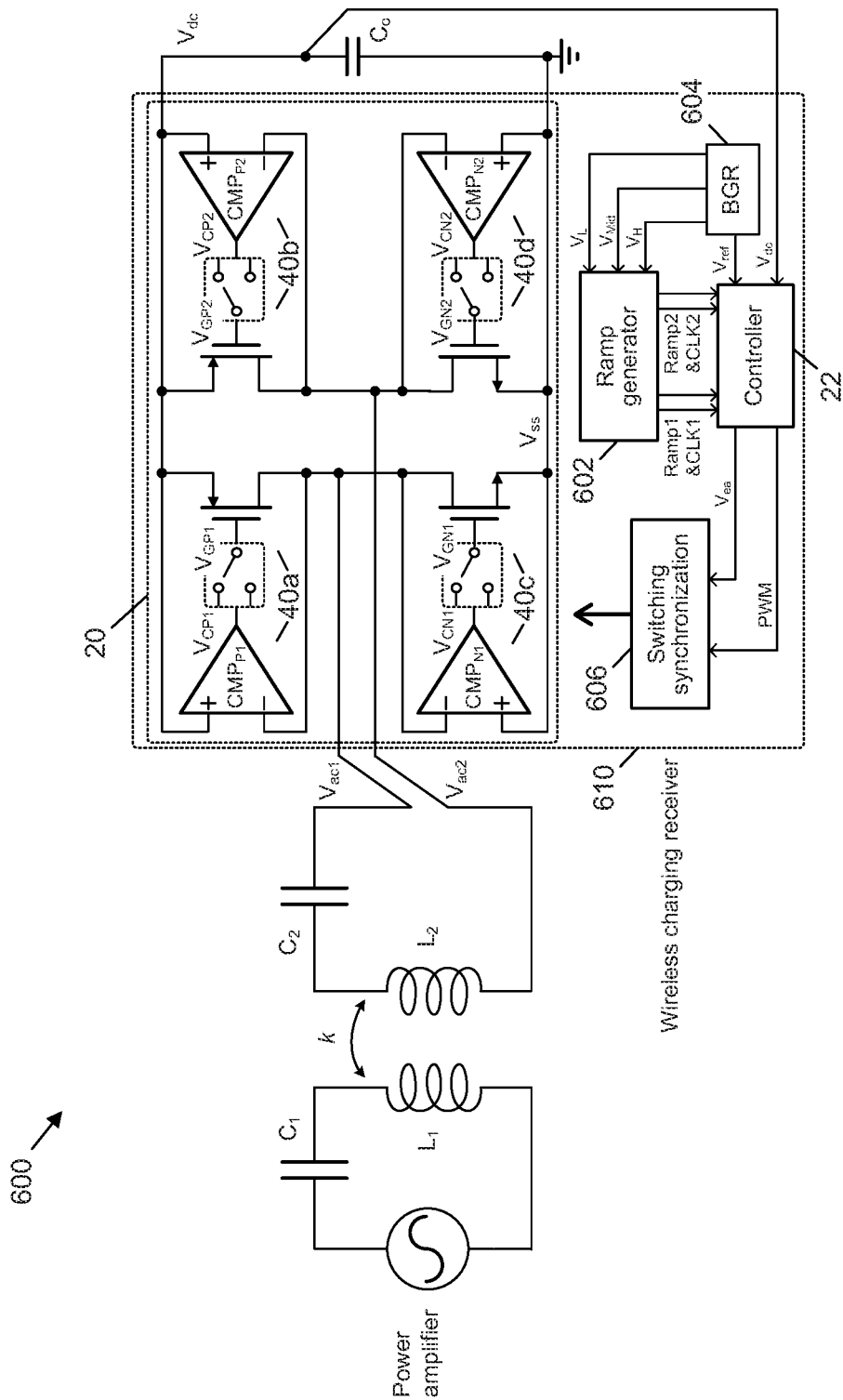
FIG. 6 is a schematic block diagram of a wireless charging receiver.

FIG. 6 illustrates an example implementation of a wireless power receiver 600, As shown in FIG. 6, the power stage of wireless power receiver 600 includes a reconfigurable rectifier, such as rectifier 20. The rectifier is controlled by a controller 22 with the aid of a ramp generator 602, BGR (bandgap reference) 604, and switching synchronizations circuits 606, Operation of the controller 22 and its associated components 602, 604, 606 is discussed in further detail below. In one embodiment, controller 22 is a PWM controller, in which case the mode cycling schemes discussed above with regard to FIGS. 3-4, are PWM cycling schemes. Other controller types, such as a hysteretic controller, could be used in addition to and/or in place of a PWM controller.

Figure 7:
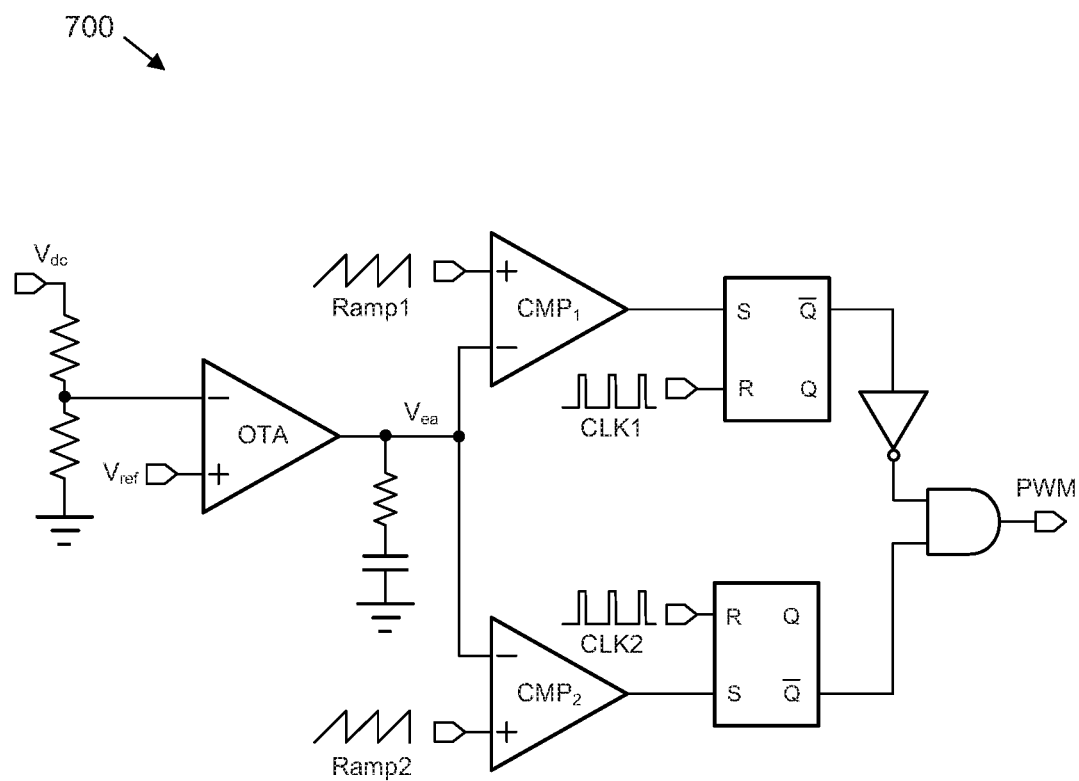
FIG. 7 is a schematic diagram of a controller employable by the wireless charging receiver of FIG. 6.
Figure 8:
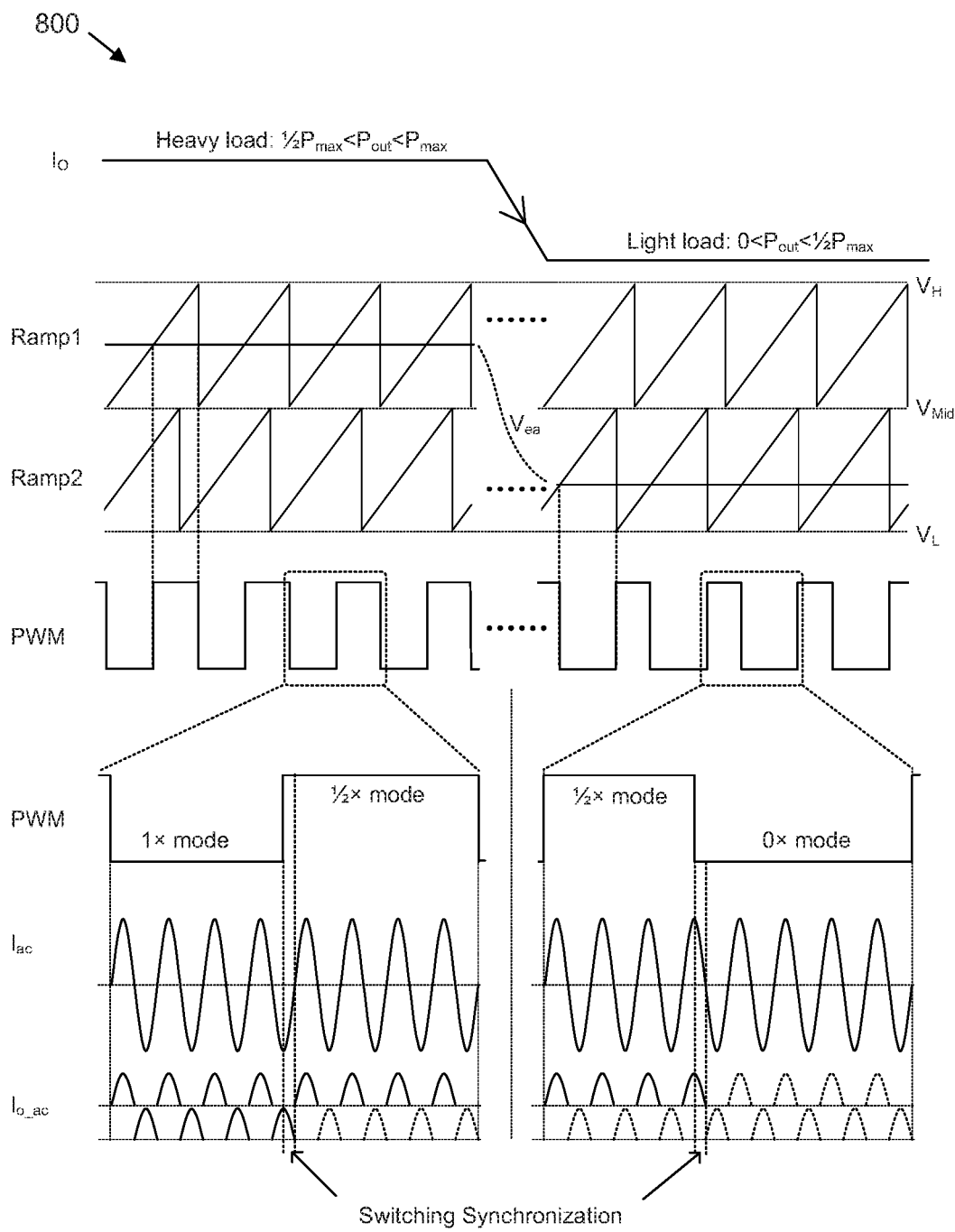
FIG. 8 is a diagram illustrating example operation of the controller of FIG. 7.

One implementation of controller 22 as a PWM controller is illustrated by circuit 700 in FIG. 7. With further reference to FIG. 7, diagram 800 in FIG. 8 illustrates example operation data associated with controller 22 as implemented by circuit 700. Here, the mode-switching frequency is chosen to be about ⅛ of the system resonant frequency, Controller 22 senses the output voltage $V_{dc}$ and compares this voltage with the reference voltage $V_{ref}$, A compensation scheme such as Type-II compensation, dominant-pole compensation, etc., is employed to achieve fast transient responses. To implement three-level operation with automatic transition between heavy load and light load as described above with regard to FIGS. 3-4, the output of the compensator, $V_{ea}$, is compared with two stacked ramp signals: Ramp1 and Ramp2. As shown in diagram 800, Ramp1 and Ramp2 have the same amplitude and frequency but differ in that Ramp2 operates between $V_L$ to $V_{MID}$ and Ramp1 operates from $V_{MID}$ to $V_H$. In cases of heavy load, $V_{ea}$ is driven into the range of Ramp1, and rectifier 20 switches between 1× mode and ½× mode. In cases of light load, $V_{ea}$ is driven into the range of Ramp2 and rectifier 20 switches between ½× mode and 0× mode.

In one embodiment, the working principle of the PWM controller as described above is summarized as follows.

1) Heavy load (½$I_{max}$<$I_o$<$I_{max}$): The feedback loop will drive $V_{EA}$ into the range of Ramp1, so $Q_L$ keeps at "1" and the PWM signal is determined by $Q_H$. Rectifier 20 switches between 1× mode and ½× mode. The duty cycle of ½× mode $D_H$ is determined by comparing $V_{EA}$ with Ramp1, and a lower $V_{EA}$ results in a larger $D_H$.

2) Light load (0<$I_o$<½$I_{max}$): The feedback loop will drive $V_{EA}$ into the range of Ramp2, so $Q_H$ keeps at "1" and the PWM signal is determined by $Q_L$. Rectifier 20 switches between 0× mode and ½× mode. The duty cycle of ½× mode $D_L$ is determined by comparing $V_{EA}$ with. Ramp2, and a higher $V_{EA}$ results in a larger $D_L$.

3) Intermediate load ($I_o$=½$I_{max}$) and $V_{EA}$=$V_{MID}$: Depending on the mode in which rectifier 20 is working (e.g., heavy load or light load), either $D_H$ or $D_L$ is equal to 1, Hence, smooth transition between heavy load and light load can be achieved. The duty cycle of a conventional switching converter working in continuous conduction mode is almost independent of the loading current; however, it is approximately proportional to the loading current in rectifier 20.

Figure 9:
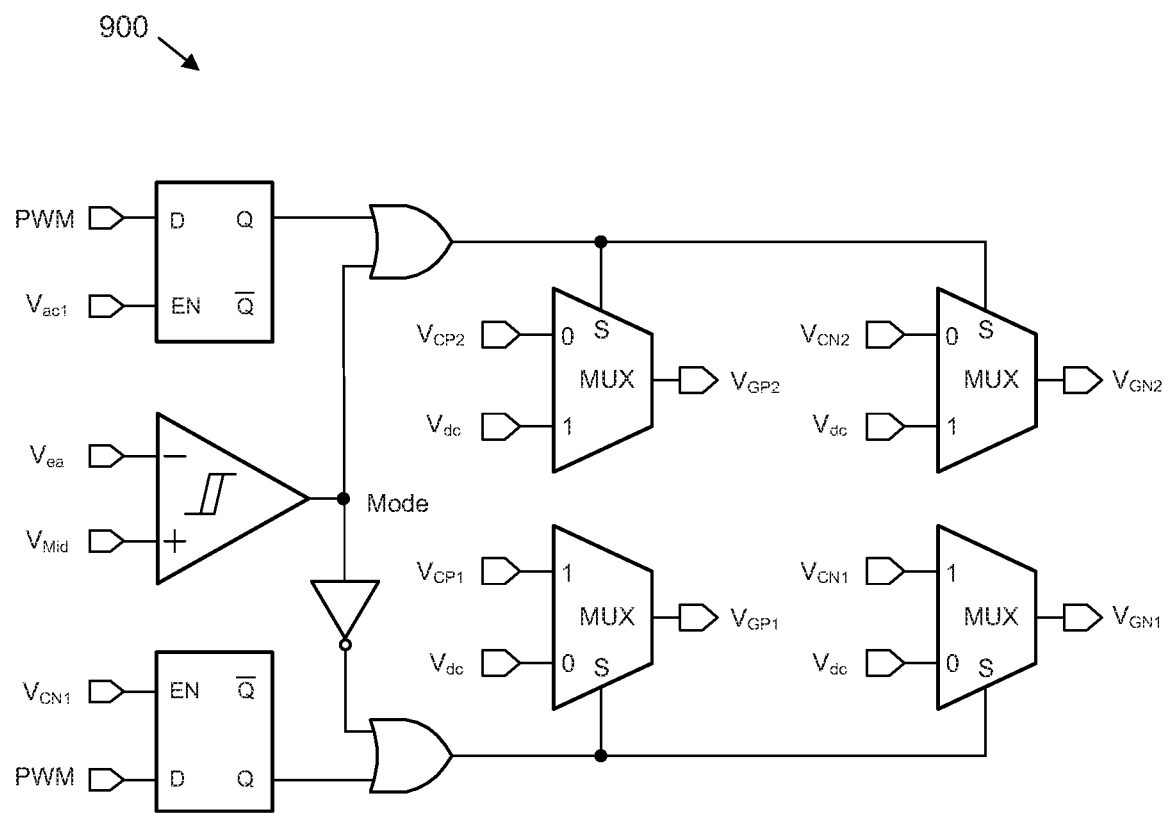
FIG. 9 is a schematic diagram of example switching synchronization circuits employable by the wireless charging receiver of FIG. 6.

Turning next to FIG. 9, one implementation of switching synchronization circuits 606 is illustrated by circuit 900, When driving heavy load, the gate signal $V_{GN1}$ of $M_{N1}$ and the gate signal $V_{GP1}$ of $M_N$ are obtained from $V_{CN1}$ and $V_{CP1}$, respectively. As a result, the gate signals do not change. When driving light load, $V_{GN1}$ changes between $V_{CN1}$ for ½× mode and $V_d$, for 0× mode. Similarly, $V_{GP1}$ changes between $V_{CP1}$ for ½× mode and $V_{dc}$ for 0× in light load conditions. In the above light loading case, $V_{GN1}$ and $V_{GP1}$ are changed when $V_{CN1}$ and $V_{CP1}$ have a value of "1," respectively.

With regard to $M_{N2}$ and $M_{P2}$, the gate signal $V_{GN2}$ of $M_{N2}$ changes between $V_{CN2}$ for 1× mode and $V_d$, for ½× mode when $V_{ac1}$ is "1" at heavy load and is connected to $V_{dc}$ without changing at light load. Similarly, the gate signal $V_{GP2}$ of $M_{P2}$ changes between $V_{CP2}$ for 1× mode and $V_{dc}$ for ½× mode when $V_{ac1}$ is "1" at heavy load and is connected to $V_{dc}$ without changing at light load. To determine the load condition, a hysteresis comparator compares $V_{ea}$ and $V_{mid}$ and makes a load condition determination based on this comparison.

Figure 10:
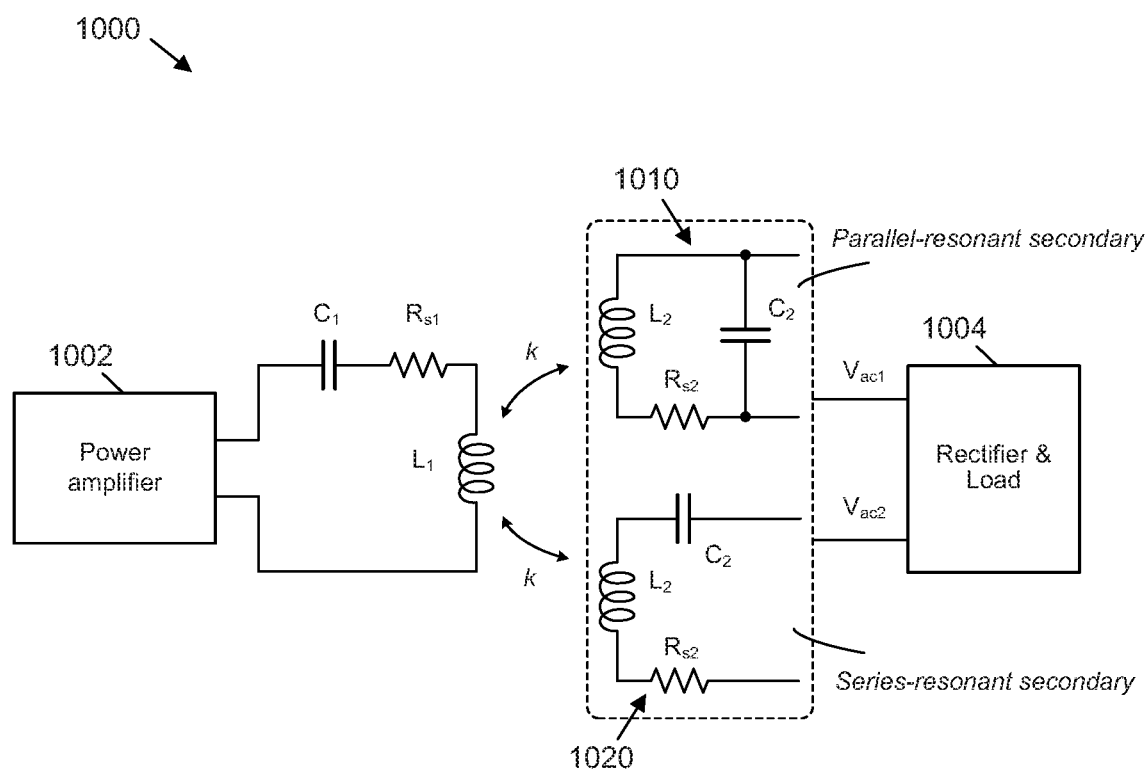
FIG. 10 is a schematic block diagram of a power link of a resonant wireless power transfer (R-WPT) system.

Turning next to FIG. 10, diagram 1000 illustrates an example power link of a WPT system, An ISM band frequency, such as 6.78 MHz or 13.56 MHz, can be selected as the resonant frequency $f_s$ of the LC tank. Other frequencies are also possible. A power amplifier 1002 drives the primary coil $L_1$ (with parasitic resistance $R_{s1}$) to generate magnetic fluxes that induce an AC voltage at the secondary coil $L_2$ (with parasitic resistance $R_{s2}$). Secondary coil $L_2$ can either be parallel-tuned or series-tuned by the capacitor $C_2$, resulting in a parallel-resonant secondary 1010 or a series-resistant secondary 1020, respectively. The coupling coefficient k depends on the geometry, distance and alignment of the coils. The tuned circuit is then cascaded with a rectifier 1004 that converts the AC voltage to a DC voltage for powering up the loading circuits.

In an aspect, various properties of series-resistant secondary 1020 are given below. Similar concepts could also be applied to parallel-resistant secondary 1010. The following analysis assumes a full-bridge rectifier, but other rectifiers could be used. The input resistance of the rectifier $R_{L\_ac}$ and the reflected equivalent resistance of the secondary $R_{eq}$ are given by the following:

$$R_{L\_ac} = \frac{8}{\pi^2}R_L;\ R_{eq} = \frac{\omega^2 M^2}{R_{L\_ac} + R_{s2}} \quad (1)$$

where ω (=2π$f_s$) is the resonance frequency of the LC tank in rad/s and $f_s$ is, e.g., 6.78 MHz. M is the mutual inductance between the coils. The efficiencies of the primary and the secondary stage are given by the following:

$$\eta_{prim} = \frac{R_{eq}}{R_{eq} + R_{s1}}; \eta_{sec} = \frac{R_{L\_ac}}{R_{L\_ac} + R_{s2}} \quad (2)$$

The input power injected into the inductive link $P_{in}$ and the output power $P_{out}$ are given by:

$$P_{in} = \frac{V_{prim}^2}{2(R_{eq} + R_{s1})} \quad (3)$$

$$P_{out} = P_{link\_in} \times \eta_{prim} \times \eta_{sec} \quad (4)$$

where $V_{prim}$ is the magnitude of the AC source. Therefore, the RMS current of the secondary tank $I_{rms}$ and the output voltage of the rectifier $V_{rect}$ are computed as $$I_{rms} = \sqrt{\frac{P_{out}}{R_{L\_ac}}} = \frac{\omega M}{\omega^2 M^2 + R_{s1}(R_{L\_ac} + R_{s2})} \frac{V_{prim}}{\sqrt{2}} \quad (5)$$

$$V_{rect} = \frac{2\sqrt{2}}{\pi} I_{rms} R_L \quad (6)$$

Figure 11:
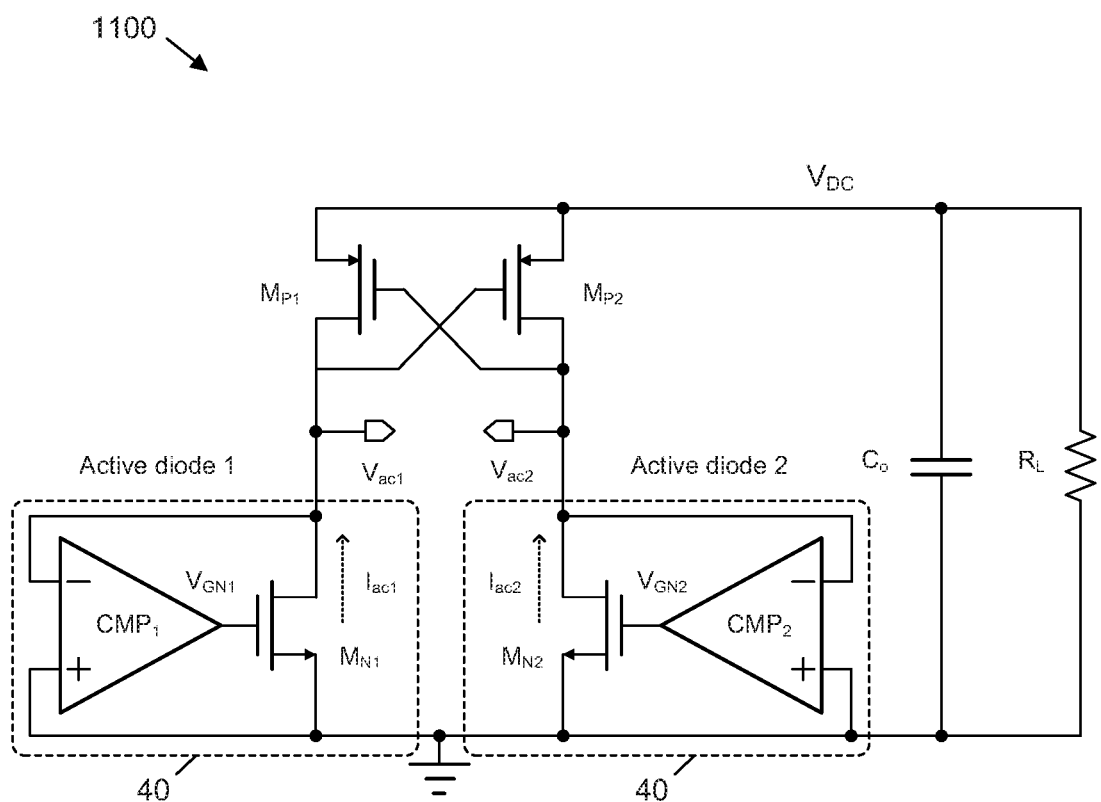
FIG. 11 is a schematic diagram of an active rectifier with active diodes.

As discussed above, the design of rectifier 1004 affects system efficiency, and poor efficiency may produce heat at an associated implant or charger and/or cause other deleterious effects. Accordingly, passive diodes with forward voltage drops of 0.7 V are replaced by active diodes implemented by CMOS transistors and comparators to implement an active rectifier, as shown by diagram 1100 in FIG. 11. The operating principle of the active rectifier of FIG. 11 is as follows. When $V_{ac2} - V_{ac1} > |V_{tP}|$ (the threshold voltage of $M_{P1,2}$), $M_{P2}$ is turned on, Additionally, when $V_{ac1} < 0$, the comparator $CMP_1$ turns on $M_{N1}$, charging up $V_{DC}$ by $V_{ac}$. After $V_{ac1}$ swings above zero, $M_{N1}$ is turned off by $CMP_1$. During the next half of the AC input cycle, the other half of the rectification circuit conducts in a similar fashion. In the absence of delay, $M_{N1}$ is turned on once after $V_{ac1}$ swings below 0, and $M_{N2}$ is turned off once after $V_{ac2}$ swings above 0. However, propagation delays of the comparator and the gate driver result in fluctuations to this operation as noted above.

Figure 12:
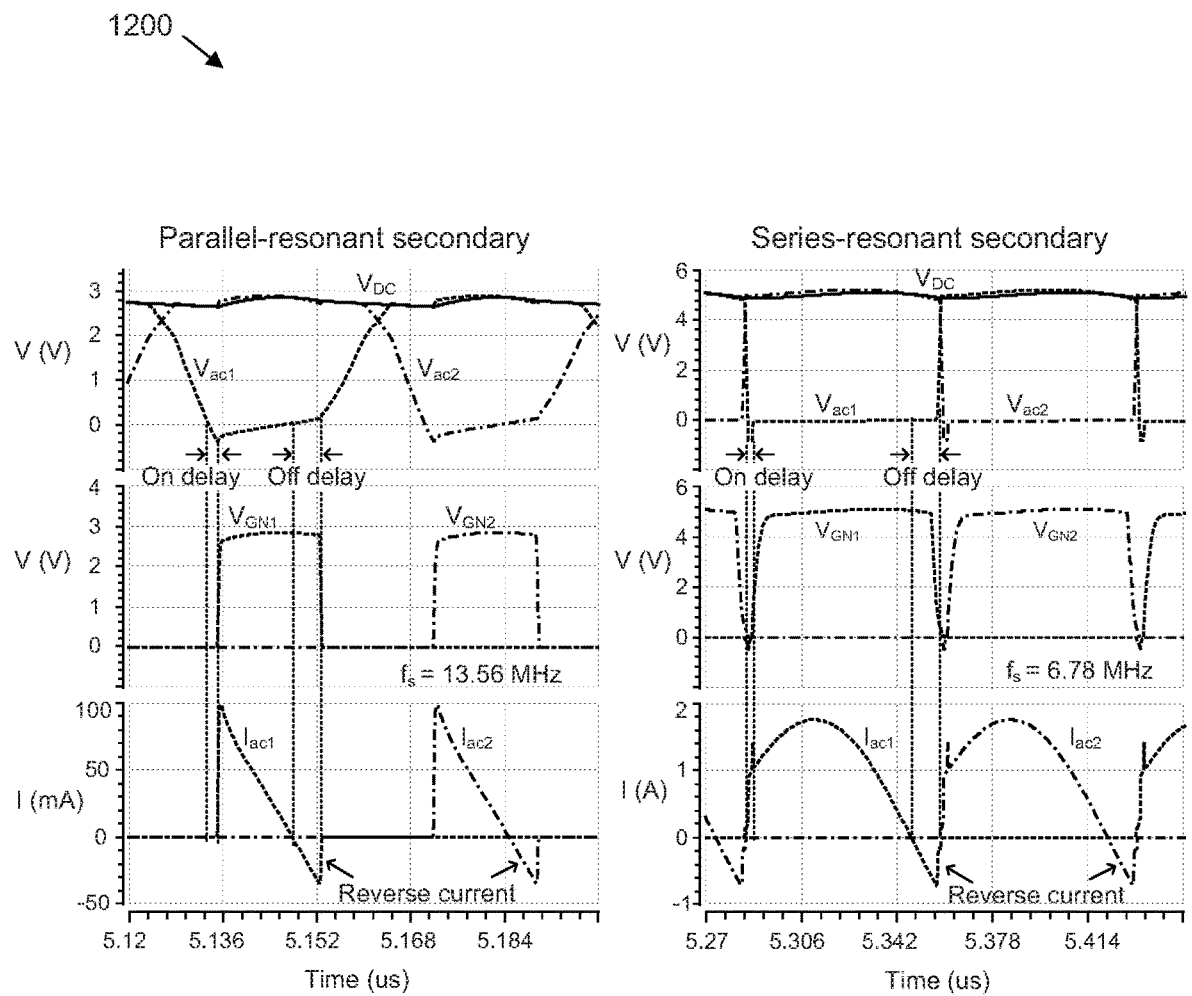
FIG. 12 is a diagram of example waveform data corresponding to operation of the active rectifier of FIG. 11.

Diagram 1200 in FIG. 12 illustrates waveform data associated with the parallel-resonant secondary 1010 and series-resonant secondary 1020 shown in diagram 1000. As shown in diagram 1200, for parallel-resonant secondary 1010, the turn-on delay shortens the conduction time and increases the peak current, and the turn-off delay results in reverse current that flows from the output capacitor back to ground. For series-resonant secondary 1020, the turn-on delay enables body-diode conduction of $M_{N1,2}$, and the turn-off delay also results in reverse current.

As discussed above, a WPT power link utilizes a power amplifier to drives a primary coil in order to generate magnetic fluxes that induce an AC voltage at a secondary coil, A rectifier including diodes is used to convert the secondary AC voltage to a DC voltage for powering up the loading circuits. The design of the rectifier affects system efficiency, and poor efficiency can cause heat buildup and other detrimental effects, especially in the case of biomedical implants and/or other use cares where physical comfort is a consideration. Accordingly, passive diodes with forward voltage drops of about 0.7 V are replaced by active diodes implemented by CMOS (complementary metal-oxide-semiconductor) transistors and comparators. The lower voltage drops associated with active diodes result in higher voltage conversion ratio (VCR) and higher power conversion efficiency (PCE), among other benefits.

However, when operating at a high frequency, such as an ISM (industrial, scientific, and medical) band frequency (e.g., 13.56 MHz), propagation delays of comparators and gate-drivers prevent the power transistors from being turned on and off promptly. This, in turn, degrades the performance of the active rectifier in terms of VCR and PCE and/or by other metrics.

In view of the above, an adaptive turn-on and turn-off delay compensation scheme is described that reduces and/or eliminates the propagation delays of comparators and gate-drivers of the active diodes adaptively. While the description and related drawings below relate to a full-bridge rectifier, the delay compensation techniques described herein can be implemented in any rectifier without departing from the scope of the following description and its corresponding claimed subject matter. For respective active diodes of a rectifier, the delay compensation scheme utilizes dedicated feedback loops (e.g., two feedback loops) to compensate for both the turn-on delay and the turn-off delay of the comparator and the gate-driver. The delay compensation techniques described herein are effective in substantially all working conditions and can be used independently of PVT (process/voltage/temperature) variations and mismatches. Moreover, the structures utilized in connection with said schemes do not need trimming and are most suitable for mass production.

Various existing delay compensation schemes have been proposed. In some conventional schemes, a constant offset is introduced to the comparators using unbalanced bias currents or asymmetrical input transistors to compensate for the turn-off delay. However, the power transistor is also turned on later, thereby increasing the turn-on delay. Further, some techniques using this or similar processes additionally require off-chip calibration to tune the offset. In another conventional scheme, an offset voltage is added only when turning off the power transistor and is removed when turning it on. However, as both the comparator delay and the gate-driver delay are highly affected by PVT variations, the constant or dynamic offset introduced in this technique cannot accurately compensate for turn-off delay under all conditions. An additional existing technique uses a switched-offset biasing scheme for better controlling reverse current, hut this technique still suffers from PVT variations and the design procedure is complicated. In still another technique, a positive feedback loop is used to speed up the response of the comparators, but the delays are still large.

In general, existing delay-compensation schemes suffers from PVT variations and mismatches, and cannot accurately compensate for the turn-on delay and turn-off delay under all conditions. Accordingly, a solution that is insensitive to PVT variations is desirable for high-performance active diodes. To the furtherance of this and/or related ends, an adaptive turn-on and turn-off delay compensation scheme as described herein utilizes two feedback loops in conjunction with the active diodes of a rectifier, and both turn-on delay and turn-off delay are fully compensated for with high precision against PVT variations and mismatches. Operation of this scheme is described in further detail below.

Figure 13:
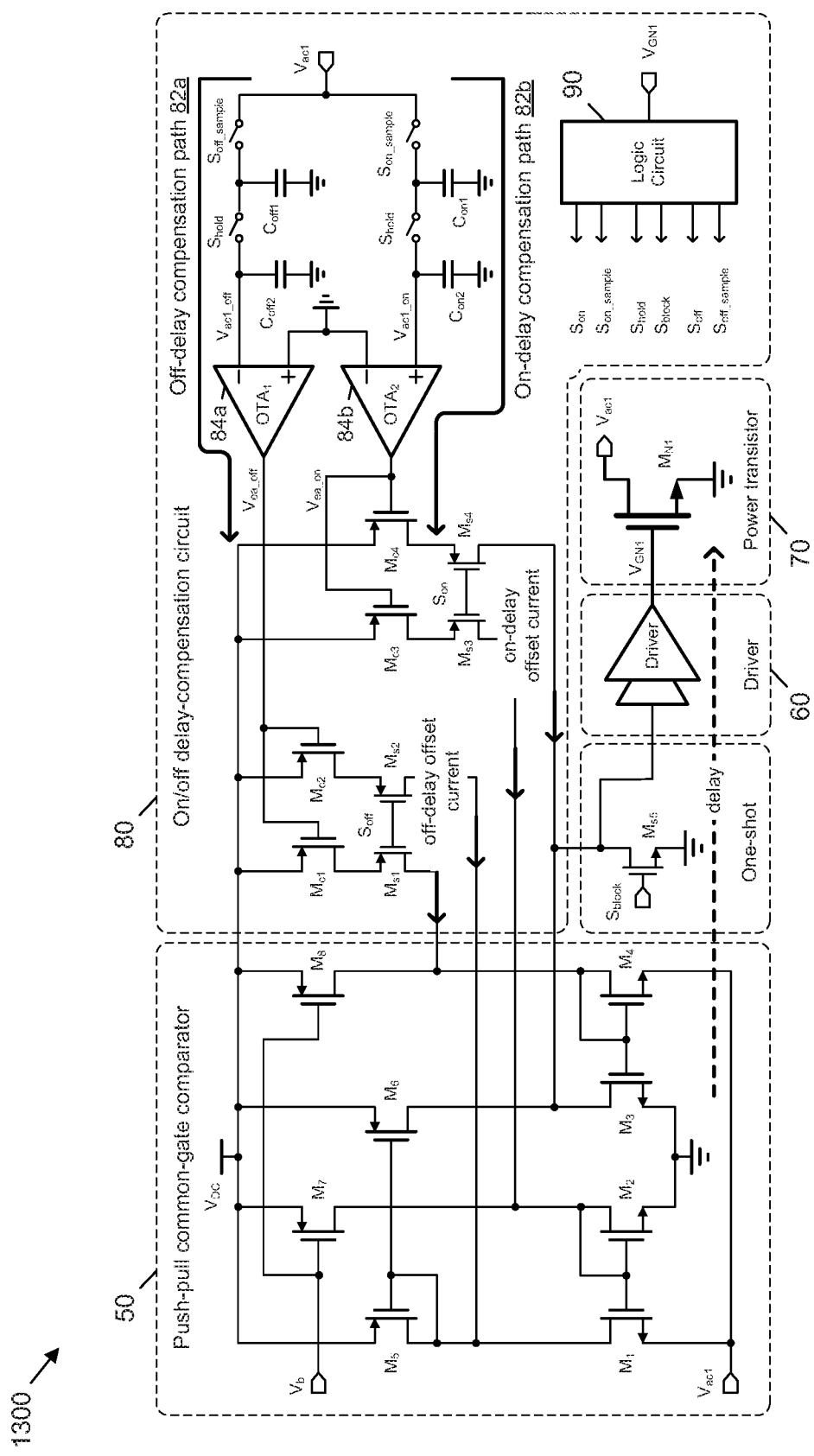
FIG. 13 is a schematic diagram of an active diode with adaptive on/off delay compensation.

Diagram 1300 in FIG. 13 illustrates one implementation of an active diode, e.g., active diode 40, with improved delay compensation. The diode includes a comparator, e.g., push-pull common-gate comparator 50, a gate driver 60, a power transistor 70, and adaptive turn-on and turn-off delay compensation circuits 80, Here, delay compensation circuits 80 include two feedback loops an off-delay feedback loop including a sample-and-hold circuit 82a and error/feedback amplifier 84a, and an on-delay feedback loop including a sample-and-hold circuit 82b and error/feedback amplifier 84b. Delay compensation circuits 80 may, alternatively, have only one feedback loop or more than two feedback loops.

Sample-and-hold circuits 82a-b are configured to sample a drain voltage of power transistor 70 in response to power transistor 70 being switched between an on state and an off state. Here, sample-and-hold circuit 82a on the turn-off delay compensation path obtains a sampled drain voltage in response to power transistor 70 being switched to the off state, and sample-and-hold circuit 82b on the turn-on delay compensation path obtains a sampled drain voltage in response to power transistor 70 being switched to the on state. Error amplifiers 84a-b are configured to compare the drain voltage sampled by the corresponding sample-and-hold circuits 82a-b and to generate an offset current based on a result of the comparison, A control logic circuit 90, shown in FIG. 13 in block form, is configured to control the sample-and-hold circuits 82a-b and to inject the offset currents generated by error amplifiers 84a-b to comparator 50.

In an aspect, operation of delay compensation circuits 80 can proceed as follows. For turn-off delay compensation, the voltage level of $V_{ac1}$ is initially sampled by $C_{off1}$ when $S_{off\_sample}$ is ON, and later the sampled voltage $V_{ac1\_off}$ is passed to be held on $C_{off2}$ when $S_{hold}$ is ON. The turn-off delay includes the delays of both comparator 50 and gate driver 60. Due to the turn-off delay, initially $M_{N1}$ is turned off later and $V_{ac1\_off}$ is higher than zero, Feedback amplifier 84a (OTA$_1$) compares $V_{ac1\_off}$ with ground and drives $V_{ea\_off}$ to a lower value to increase the offset currents in $M_{c1}$ and $M_{c2}$. As a result, $M_{N1}$ is turned off earlier compared to the previous cycle. After several cycles, $V_{ea\_off}$ is adjusted to a steady-state level such that $V_{ac1\_off}$ is equal to 0 V. Similar mechanisms to those described above with respect to turn-off delay compensation are also utilized by the turn-on delay compensation path. As feedback loops are used to force $V_{ac1\_on/off}$ to 0 V, both turn-on delay and turn-off delay are accurately compensated for against PVT variations and mismatches.

Figure 14:
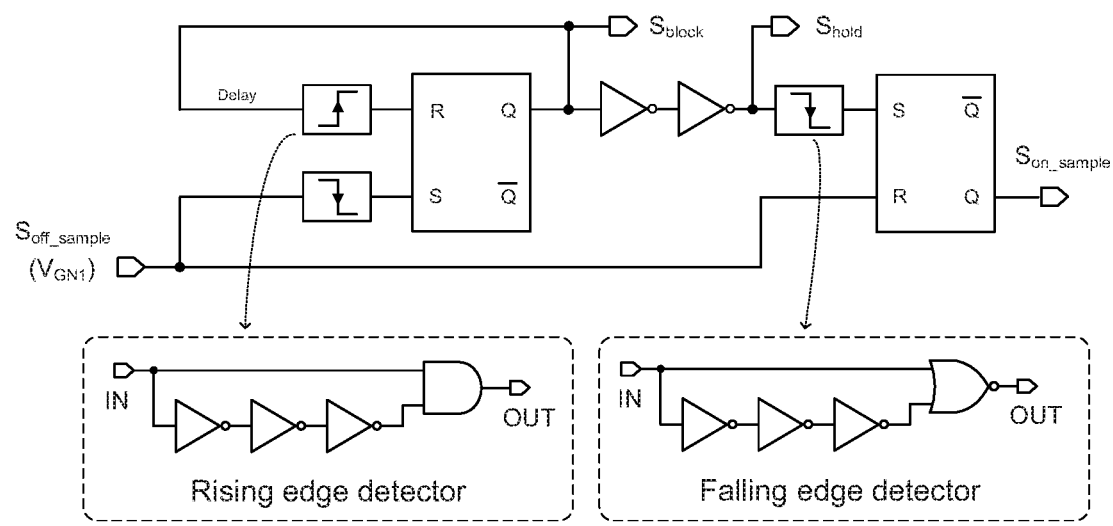
FIG. 14 is a schematic diagram of example control logic employable by the active diode of FIG. 13.
Figure 15:
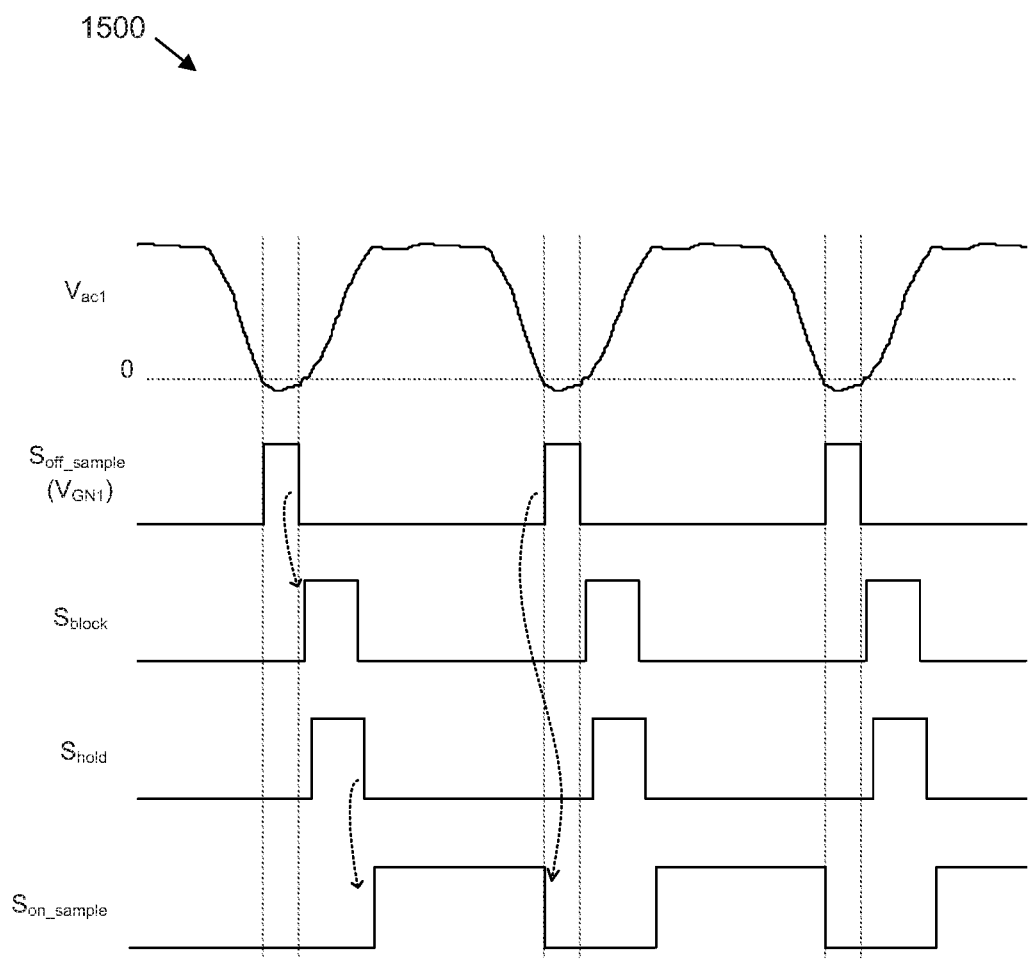
FIG. 15 is a timing diagram illustrating example operation of the active diode of FIG. 13.

One implementation of control logic 90 is illustrated by circuit 1400 in FIG. 14. Here, $S_{off\_sample}$ is the same signal as $V_{GN1}$ so that the voltage level of $V_{ac1}$ when turning $M_{N1}$ off can be sampled by $C_{off1}$. Additionally, $S_{on\_sample}$ is terminated by the rising edge of $V_{GN1}$ so that the voltage level of $V_{ac1}$ when turning $M_{N1}$ on can be sampled by $C_{on1}$. A timing diagram 1500 associated with circuit 1400 is shown in FIG. 15. As timing diagram 1500 demonstrates, $S_{hold}$ is configured not to overlap with $S_{off\_sample}$ and $S_{on\_sample}$. As further shown in diagram 1500, $S_{block}$ is used to prevent multiple-pulsing due to utilizing a switched-offset scheme. Further, the output of comparator 50 is shorted to ground for a short duration substantially immediately after $M_{N1}$ is turned off. This simple one-shot scheme ensures that $M_{N1}$ switches only once every cycle and $C_{off1}$ samples the right value.

Figure 16:
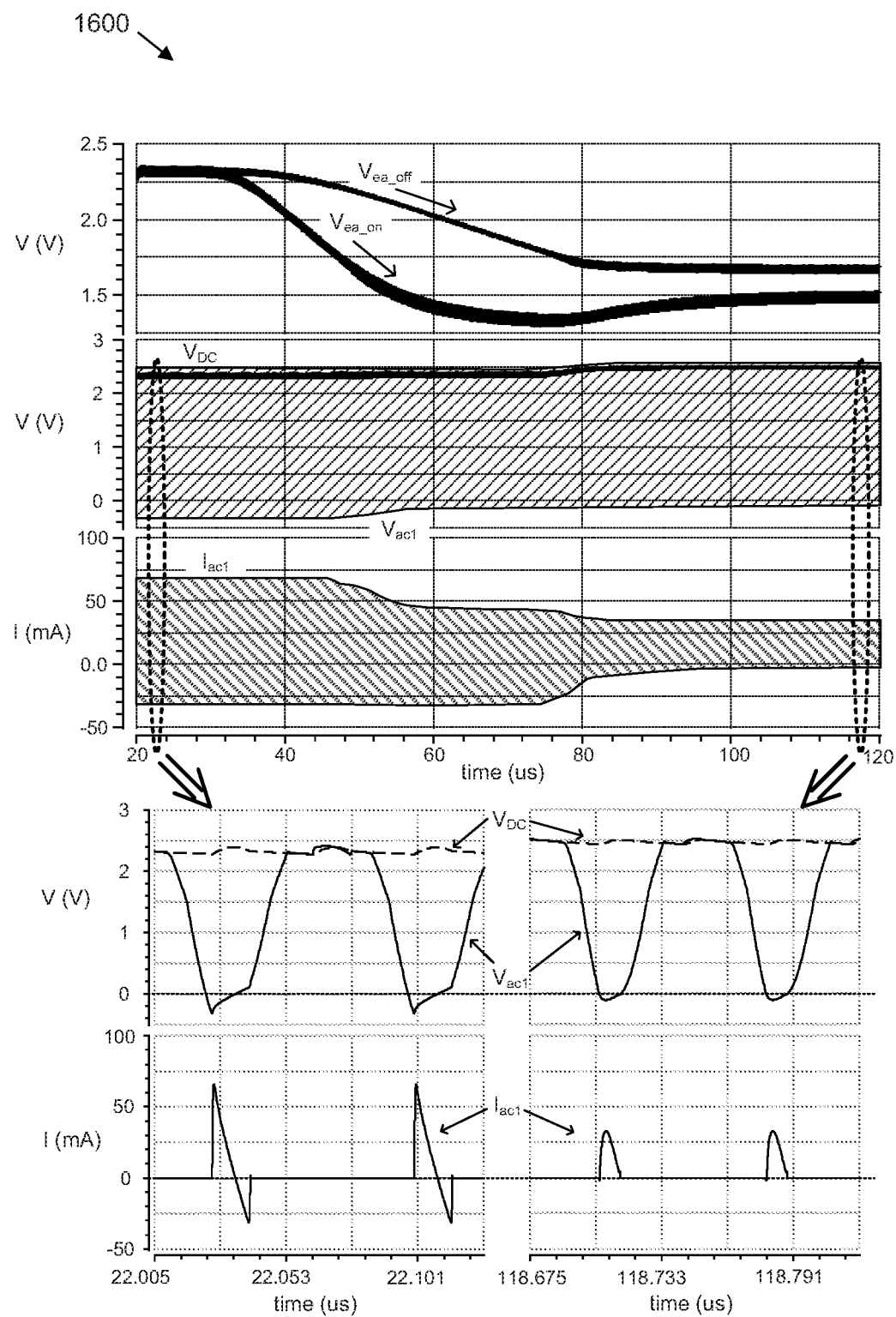
FIG. 16 is a diagram illustrating example operation of the active diode of FIG. 13.

Diagram 1600 in FIG. 16 illustrates simulation results for the process described above. Note that, while $V_{ac1}$ and $I_{ac1}$ are periodic waveforms, due to drawing restrictions these waveforms are depicted as line-shaded regions corresponding to the respective magnitudes of these waveforms over the indicated time interval.

Figure 17:
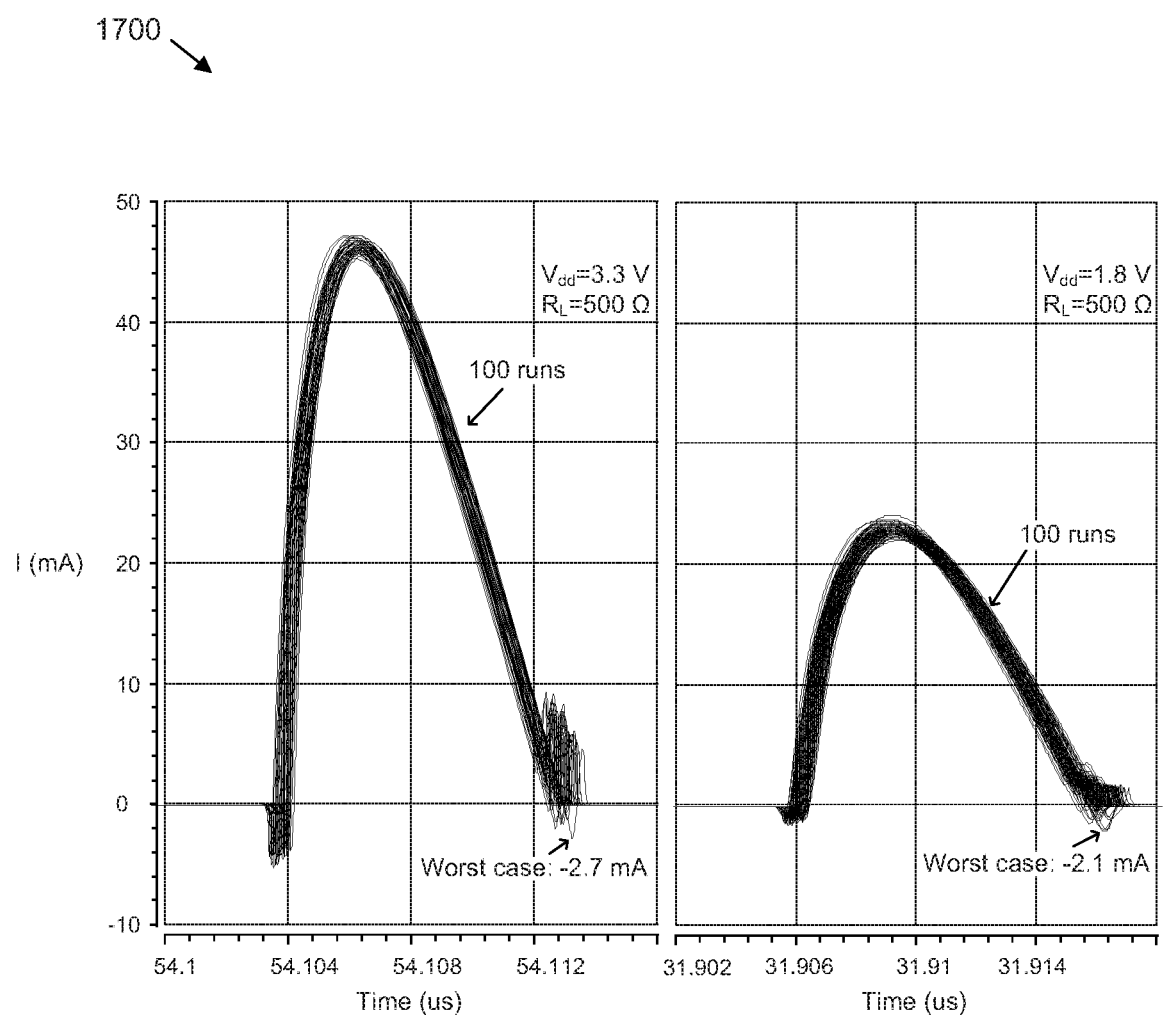
FIG. 17 is another diagram of example waveform data corresponding to operation of the active diode of FIG. 13.

Diagram 1700 in FIG. 17 illustrates the outcome of Monte Carlo simulations that were performed to evaluate the sensitivity of the active diode delay compensation schemes described herein to process variations and mismatches. As shown in diagram 1700, the turn-off delays in the worst cases are only around 0.3 ns and 0.42 ns, respectively. The corresponding reverse currents are only −2.7 mA and −2.1 mA, respectively.

Figure 18:
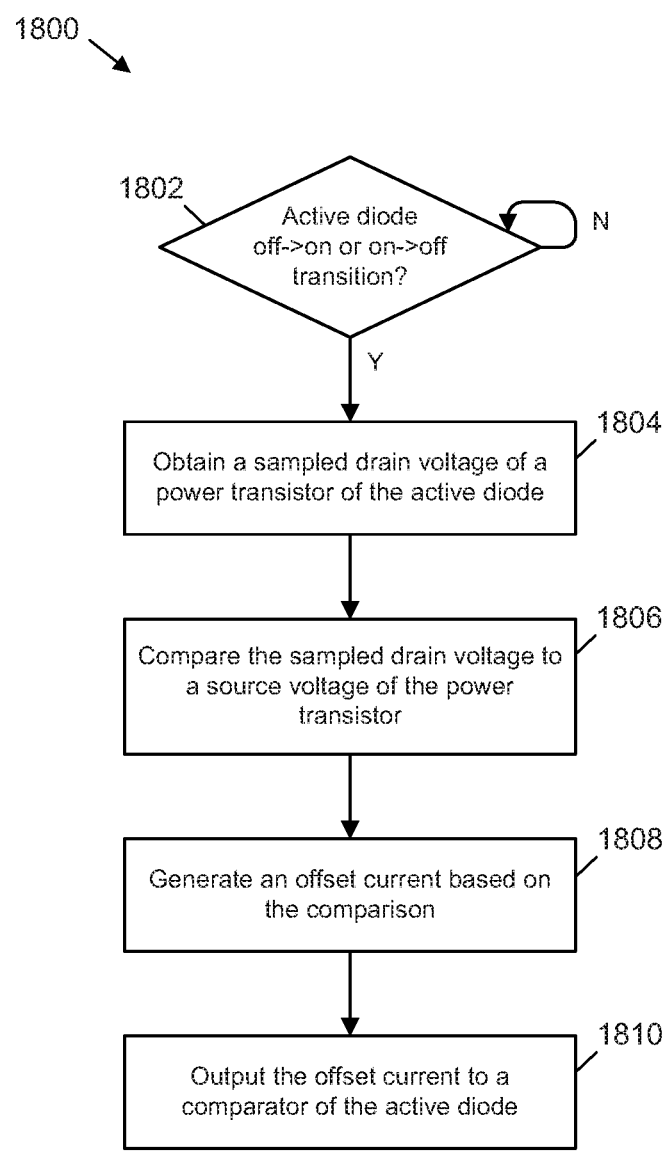
FIG. 18 is a block flow diagram of a process for compensating a state-switching delay of an active diode.

FIG. 18 illustrates a method in accordance with certain aspects of this disclosure. While, for purposes of simplicity of explanation, the methods are shown and described as a series of acts, it is to be understood and appreciated that this disclosure is not limited by the order of acts, as some acts may occur in different orders and/or concurrently with other acts from that shown and described herein. For example, those skilled in the art will understand and appreciate that methods can alternatively be represented as a series of interrelated states or events, such as in a state diagram. Moreover, not all illustrated acts may be required to implement methods in accordance with certain aspects of this disclosure.

With reference to FIG. 18, presented is a flow diagram of a process 1800 for compensating a state switching delay of an active diode, e.g., active diode 40. Process 1800 begins at 1802 by monitoring for a transition of an active diode to an on state from an off state or to an off state from an on state. If no such transition is detected, process 1800 holds at 1802. Otherwise, process 1800 proceeds to 1804 in response to the transition.

At 1804, a sampled drain voltage of a power transistor of the active diode is obtained (e.g., by sample-and-hold circuit 82).

At 1806, the sampled drain voltage obtained at 1804 is compared (e.g., by error amplifier 84) to a source voltage of the power transistor of the active diode.

At 1808, an offset current is generated (e.g., by error amplifier 84) based on the comparison performed at 1806. The offset current generated at 1808 at least partially compensates for a delay associated with the active diode transition detected at 1802.

At 1810, the offset current generated at 1808 is output (e.g., by logic circuit 90) to a comparator of the active diode, e.g., comparator 50 of active diode 40.

The offset current generated at 1810 can be a turn-off delay current, which at least partially compensates for a delay associated with an active diode transitioning to the off state from the on state. Alternatively, the offset current can be a turn-on delay current that at least partially compensates for a delay associated with the active diode transitioning to the on state from the off state. In the case of a turn-on delay current, the outputting at 1810 optionally includes monitoring a drain voltage of the power transistor of the active diode and outputting the turn-on delay offset current to the comparator of the active diode at a time at which the drain voltage begins to decrease, in response to a transition of the drain voltage from a non-decreasing state to a decreasing state.

The above description includes non-limiting examples of the various embodiments. It is, of course, not possible to describe every conceivable combination of components or methodologies for purposes of describing the disclosed subject matter, and one skilled in the art may recognize that further combinations and permutations of the various embodiments are possible. The disclosed subject matter is intended to embrace all such alterations, modifications, and variations that fall within the spirit and scope of the appended claims.

With regard to the various functions performed by the above described components, devices, circuits, systems, etc., the terms (including a reference to a "means") used to describe such components are intended to also include, unless otherwise indicated, any structure(s) which performs the specified function of the described component (e.g., a functional equivalent), even if not structurally equivalent to the disclosed structure. In addition, while a particular feature of the disclosed subject matter may have been disclosed with respect to only one of several implementations, such feature may be combined with one or more other features of the other implementations as may be desired and advantageous for any given or particular application.

The terms "exemplary" and/or "demonstrative" as used herein are intended to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent structures and techniques known to one skilled in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The term "or" as used herein is intended to mean an inclusive "or" rather than an exclusive "or." For example, the phrase "A or B" is intended to include instances of A, B, and both A and B. Additionally, the articles "a" and "an" as used in this application and the appended claims should generally be construed to mean "one or more" unless either otherwise specified or clear from the context to be directed to a singular form.

The term "set" as employed herein excludes the empty set, i.e., the set with no elements therein. Thus, a "set" in the subject disclosure includes one or more elements or entities. Likewise, the term "group" as utilized herein refers to a collection of one or more entities.

The description of illustrated embodiments of the subject disclosure as provided herein, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as one skilled in the art can recognize. In this regard, while the subject matter has been described herein in connection with various embodiments and corresponding drawings, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A wireless charging receiver, comprising:
    a configurable rectifier configured to convert an alternating current input to a direct current output in a single processing stage, wherein the configurable rectifier comprises one or more active diodes; and
    a controller, communicatively coupled to the one or more active diodes, configured to select one of a group of mode cycling schemes, resulting in a selected mode cycling scheme, and control a present operating mode of the one or more active diodes according to the selected mode cycling scheme, wherein the present operating mode comprises a group of operating modes, and wherein the group of operating modes comprises a freewheeling diode mode.

2. The wireless charging receiver of claim 1, wherein the mode cycling schemes comprise:
    a first mode cycling scheme configured to cycle the present operating mode of the one or more active diodes between a first operating mode and a second operating mode; and
    a second mode cycling scheme configured to cycle the present operating mode of the one or more active diodes between the second operating mode and a third operating mode.

3. The wireless charging receiver of claim 2, wherein the first operating mode is a full-bridge rectifier mode.

4. The wireless charging receiver of claim 2, wherein the second operating mode is a half-bridge rectifier mode.

5. The wireless charging receiver of claim 2, wherein the third operating mode is the freewheeling diode mode.

6. The wireless charging receiver of claim 2, wherein the first operating mode, the second operating mode, and the third operating mode are periodic operating modes having a common period.

7. The wireless charging receiver of claim 2, wherein the controller is configured to select between the first mode cycling scheme and the second mode cycling scheme based at least in part on a load level of the wireless charging receiver.

8. The wireless charging receiver of claim 1, wherein the mode cycling schemes comprise a mode cycling scheme configured to cycle the present operating mode of the one or more active diodes between a full-bridge rectifier mode and a freewheeling diode mode.

9. The wireless charging receiver of claim 1, wherein the controller comprises a pulse width modulation (PWM) controller and the mode cycling schemes comprise PWM cycling schemes.

10. The wireless charging receiver of claim 1, wherein the controller comprises a hysteretic controller.

11. The wireless charging receiver of claim 1, wherein:
    an active diode of the one or more active diodes comprises respective feedback loops configured to compensate for respective diode synchronization delays.

12. The wireless charging receiver of claim 11, wherein the diode synchronization delays respectively comprise at least one of a turn-on delay or a turn-off delay.

13. A method, comprising:
    converting an alternating current input to a direct current output in a single processing stage using an active diode; and
    selecting a scheme of a plurality of mode cycling schemes and controlling a present operating mode of the active diode according to the scheme, wherein the present operating mode comprises a plurality of operating modes, and wherein the plurality of operating modes comprises a freewheeling diode mode.

14. The method of claim 13, wherein the plurality of mode cycling schemes further comprises:

a first mode cycling scheme configured to cycle the present operating mode of the active diode between a first operating mode of the plurality of operating modes and a second operating mode of the plurality of operating modes; and a second mode cycling scheme configured to cycle the present operating mode of the active diode between the second operating mode and a third operating mode of the plurality of operating modes.

15. The method of claim 14, wherein the first operating mode is a full-bridge rectifier mode.

16. The method of claim 14, wherein the second operating mode is a half-bridge rectifier mode.

17. The method of claim 14, wherein the third operating mode is the freewheeling diode mode.

18. A charging system, comprising:

a configurable rectifier configured to convert an alternating current input to a direct current output in a single processing stage, wherein the configurable rectifier comprises at least one active diode; and a controller, communicatively coupled to the at least one active diode, configured to select a mode cycling scheme of multiple mode cycling schemes and control a present operating mode of the at least one active diode according to the mode cycling scheme, wherein the present operating mode comprises multiple operating modes, and wherein the multiple operating modes comprise a freewheeling diode mode, and wherein an active diode of the at least one active diode comprises respective feedback loops configured to compensate for respective diode synchronization delays.

19. The charging system of claim 18, wherein the active diode further comprises a power transistor, and wherein the respective feedback loops comprise:

respective sample-and-hold circuits;

respective error amplifiers; and respective logic circuits.

20. The charging system of claim 19, wherein the respective sample-and-hold circuits are configured to sample a first voltage of the power transistor resulting in respective sampled first voltages in response to the power transistor being switched between an on state and an off state and further configured to hold the respective sampled first voltages.

* * * * *